United States Patent
Wu et al.

(10) Patent No.: US 12,089,367 B2
(45) Date of Patent: Sep. 10, 2024

(54) LIQUID-COOLING PLATE FOR CPU

(71) Applicants: INVENTEC (PUDONG) TECHNOLOGY CORPORATION, Shanghai (CN); INVENTEC CORPORATION, Taipei (TW)

(72) Inventors: Jiangjun Wu, Shanghai (CN); Pinyi Xiang, Shanghai (CN); Ke Sun, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 176 days.

(21) Appl. No.: 17/843,792

(22) Filed: Jun. 17, 2022

(65) Prior Publication Data

US 2023/0292461 A1    Sep. 14, 2023

(30) Foreign Application Priority Data

Mar. 14, 2022 (CN) .......................... 202210249323.9

(51) Int. Cl.
*H05K 7/20* (2006.01)
(52) U.S. Cl.
CPC ..... *H05K 7/20254* (2013.01); *H05K 7/20272* (2013.01); *H05K 7/20809* (2013.01)
(58) Field of Classification Search
None
See application file for complete search history.

(56) References Cited

U.S. PATENT DOCUMENTS

| 11,175,102 | B1 * | 11/2021 | Harrington | ........... H01L 23/473 |
| 11,729,946 | B2 * | 8/2023 | Gao | ................... H05K 7/20272 361/679.53 |
| 2020/0340767 | A1 * | 10/2020 | Holden | ................... G01M 3/16 |

(Continued)

FOREIGN PATENT DOCUMENTS

| CN | 104777887 A | 7/2015 |
| CN | 206489510 U | 9/2017 |
| CN | 107615479 A | 1/2018 |

(Continued)

*Primary Examiner* — Courtney L Smith
(74) *Attorney, Agent, or Firm* — MUNCY, GEISSLER, OLDS & LOWE, PC

(57) ABSTRACT

A liquid-cooling plate for a CPU, includes a circulating liquid-cooling main body, a peripheral frame, a base and a liquid accumulation reservoir. The base has a central portion and a peripheral portion surrounding the central portion. A step is formed between the central portion and the peripheral portion so that the central portion is raised over the peripheral portion. The central portion defines an interior space and has a cover and two faucets. The interior space is adapted to accommodate the circulating liquid-cooling main body, and the cover closes the interior space. The two faucets are located above the cover and communicate with the circulating liquid-cooling main body. The liquid accumulation reservoir is located external to the central portion and is adapted to contain a liquid leaked from the faucets. By integrating the liquid accumulation reservoir in the liquid-cooling plate, an effective saving in an interior space of a server is resulted.

14 Claims, 2 Drawing Sheets

(56) References Cited

U.S. PATENT DOCUMENTS

2020/0352053 A1* 11/2020 Mizerak .............. H01L 23/4735
2023/0066006 A1* 3/2023 Gao ................... H05K 7/20781

FOREIGN PATENT DOCUMENTS

| | | |
|---|---|---|
| CN | 207232874 U | 4/2018 |
| CN | 109743869 A | 5/2019 |
| CN | 110022659 A | 7/2019 |
| CN | 110996630 A | 4/2020 |
| CN | 111026253 A | 4/2020 |
| CN | 211319165 U | 8/2020 |
| CN | 211878562 U | 11/2020 |
| CN | 112764505 A | 5/2021 |
| CN | 113056964 A | 6/2021 |
| CN | 113377180 A | 9/2021 |
| CN | 113594113 A | 11/2021 |
| CN | 113849053 A | 12/2021 |
| CN | 113985165 A | 1/2022 |
| EP | 3518640 A1 | 7/2019 |
| JP | 2008287733 A | 11/2008 |

* cited by examiner

LIQUID-COOLING PLATE FOR CPU

CROSS-REFERENCE TO RELATED APPLICATION

This application claims the priority of Chinese patent application number 202210249323.9, filed on Mar. 14, 2022, the entire contents of which are incorporated herein by reference.

TECHNICAL FIELD

The present invention relates to the field of server cooling technology and, more specifically, to a liquid-cooling plate for a CPU.

BACKGROUND

The ever increasing power of electronic chips brings about increasingly dense heat fluxes, leading to heat concentration across CPU surfaces. The traditional air-cooling technology has the risk of being unable to meet such heat dissipation requirements. The liquid-cooling technology features fast heat dissipation, reduced noise, consistent heat dissipation performance and other advantages and thus starts being widely used. As a core component of liquid-cooling technology, a liquid-cooling plate works by introducing a cooling liquid to the inside of the cold plate through an external manifold and a faucet, where the cooling liquid is forced to convect, thus transferring heat away from the CPU surface.

Existing liquid-cooling plates are associated with the following problems: the liquid may leak from an interface of the faucet and the manifold (e.g., due to inadequate tightening, loosening or other reasons) and cause a short circuit inside an electronic chip or a motherboard, which may damage components therein and cause a shutdown of the system; moreover, in the event of liquid leakage, even when a water leak detection rope gives a warning, as troubleshooting and repair by an operator would take some time, it is still possible for the leaked liquid to flow to the motherboard or individual components during this time to cause a short circuit across some component, posing a threat to the system's safe operation. In addition, although the existing liquid-cooling plates are equipped with a separate liquid accumulation reservoir under said interface in order to store the leaked liquid and allow some time for the operator. However, such conventional liquid accumulation reservoirs have a large footprint which affects the layout and distribution of other components on the motherboard.

SUMMARY OF THE DISCLOSURE

It is an object of the present invention to provide a liquid-cooling plate for a CPU, which integrates a liquid accumulation reservoir, thus resulting in a saving in an interior space of the CPU.

To this end, the present invention provides a liquid-cooling plate for a CPU, for use with a circulating liquid-cooling main body, the liquid-cooling plate comprising a peripheral frame, a base and at least one liquid accumulation reservoir, the base having a central portion and a peripheral portion surrounding the central portion, the peripheral frame disposed on the peripheral portion so that the central portion is exposed from the peripheral frame, the central portion and the peripheral portion forming a step therebetween so that the central portion is raised over the peripheral portion, the central portion defining an interior space and having a cover and two faucets, the interior space configured to accommodate the circulating liquid-cooling main body, the cover closing the interior space, the two faucets located above the cover and communicating with the circulating liquid-cooling main body, the liquid accumulation reservoir located external to the central portion and configured to contain a liquid leaked from at least one of the two faucets.

In a preferred embodiment of the present invention, the liquid accumulation reservoir has a depth ranging from 1 mm to h, where h represents a thickness of the peripheral frame and is greater than 1 mm. Preferably, the peripheral frame is an annulus, and the liquid accumulation reservoir is arranged proximal to an inner edge of the peripheral frame. If the depth of the liquid accumulation reservoir is less than h, the liquid accumulation reservoir is delimited by the peripheral frame and the central portion. If the depth of the liquid accumulation reservoir is equal to h, the liquid accumulation reservoir is delimited by the peripheral frame, the peripheral portion and the central portion.

In a preferred embodiment of the present invention, the peripheral frame and the base are integrally or separately formed with each other. Preferably, the peripheral frame and the base are separately formed with each other, a water-resistant film is provided on an inner wall of the liquid accumulation reservoir. The water-resistant film is configured to close a gap between the peripheral frame and the base.

In a preferred embodiment of the present invention, one or two liquid accumulation reservoirs are included. In case of a single liquid accumulation reservoir, the liquid accumulation reservoir has an annular, U-like, L-like or rectangular shape. In case of two liquid accumulation reservoirs, they have U-like, L-like or rectangular shapes.

In a preferred embodiment of the present invention, there is a height difference between top surfaces of the cover and the central portion, and the top surface of the cover is lower than the top surface of the central portion. Preferably, the height difference is 0.3 mm.

Preferably, the faucets are rotatably disposed above the top surface of the cover and have joint gaps located right above the cover.

Additionally, the cover has a liquid accumulation portion and a liquid guide portion, which communicate with each other, the liquid accumulation portion being configured to preliminarily store the liquid leaked from the faucets, the liquid guide portion located on one or two sides of the liquid accumulation portion, wherein the liquid accumulation reservoir is located external to the liquid guide portion.

Additionally, in case of a single liquid accumulation reservoir, the cover has one liquid guide portion, and the top surface of the cover is inclined so as to be lowest at an edge of the liquid guide portion proximal to the liquid accumulation reservoir. In case of two liquid accumulation reservoirs, the cover has two liquid guide portions, and the two liquid accumulation reservoirs are located on two sides of the two liquid guide portion, wherein the top surface of the cover is either a horizontal surface that is spaced from the top surface of the peripheral frame by a constant height difference, or a ridged surface which is high at the center and low at two opposing edges, and is lowest at edges of the two liquid guide portions proximal to the respective two liquid accumulation reservoirs. Wherein, a projection of each of the liquid guide portions on the top surface of the peripheral frame is joined to the respective liquid accumulation reservoir so that the liquid leaked from the faucets flows into the liquid accumulation reservoir through the liquid guide portion.

Additionally, the liquid guide portion is chamfered at the edges proximal to the liquid accumulation reservoir so as to be able to guide the liquid from the cover into the liquid accumulation reservoir.

Additionally, a length of the liquid accumulation reservoir in the direction of extension thereof is greater than or equal to a length of the liquid guide portion in the direction of extension of the liquid accumulation reservoir.

In a preferred embodiment of the present invention, the liquid-cooling plate further comprises a water-absorbing medium disposed in the liquid accumulation reservoir.

In a preferred embodiment of the present invention, the liquid-cooling plate further comprises a detection rope, which is wound successively around the two faucets and is configured to detect whether liquid leakage occurs in the faucets.

As noted above, compared with the prior art, the present invention is beneficial in that the liquid accumulation reservoir is integrated in the liquid-cooling plate for a CPU. This results in a saving of an interior space of a server, dispenses with an additional occupation of the server's interior space and provides a redundant space for the layout of other components on a motherboard. Moreover, the liquid accumulation reservoir adopts a design which is reasonable and simple in structure, allows easy processing and fabrication, and does not require additional material and cost. Further, a short circuit across a component or within the motherboard caused by liquid leakage, which may affect normal operation of the equipment, or bring damage to components in the system and shorten the server's lifespan, is prevented. Furthermore, a time for troubleshooting and repair by an operator is allowed.

Particular embodiments of the present invention will be further described with reference to the following examples and drawings.

DESCRIPTION OF REFERENCE NUMERALS IN DRAWINGS

1: Liquid-cooling Plate
10: Base
11: Central Portion
12: Peripheral Portion
13: Cover
131: Liquid Guide Portion
132: Liquid Accumulation Portion
20: Peripheral Frame
31, 32: Faucets
40: Liquid Accumulation Reservoir
50: Circulating Liquid-cooling Main Body

DETAILED DESCRIPTION

The liquid-cooling plate for a CPU of the present invention will be described in greater detail below. The present invention will be described in greater detail below with reference to the accompanying drawings, which present preferred embodiments of the invention. It would be appreciated that those skilled in the art can make changes to the invention disclosed herein while still obtaining the beneficial results thereof. Therefore, the following description shall be construed as being intended to be widely known by those skilled in the art rather than as limiting the invention.

For the sake of clarity, not all features of an actual implementation are described in this specification. In the following, description and details of well-known functions and structures are omitted to avoid unnecessarily obscuring the invention. It should be appreciated that in the development of any such actual implementation, numerous implementation-specific decisions must be made to achieve specific goals of the developers, such as compliance with system-related and business-related constrains, which may vary from one implementation to another. Moreover, it should be appreciated that such a development effort might be complex and time consuming, but would nevertheless be a routine undertaking for those of ordinary skill in the art.

Objects and features of the present invention will become more apparent upon reading the following more detailed description thereof made with reference to the accompanying drawings and particular embodiments. Note that the figures are provided in a very simplified form not necessarily drawn to exact scale for the only purpose of facilitating easy and clear description of the disclosed embodiment.

Figure 1:
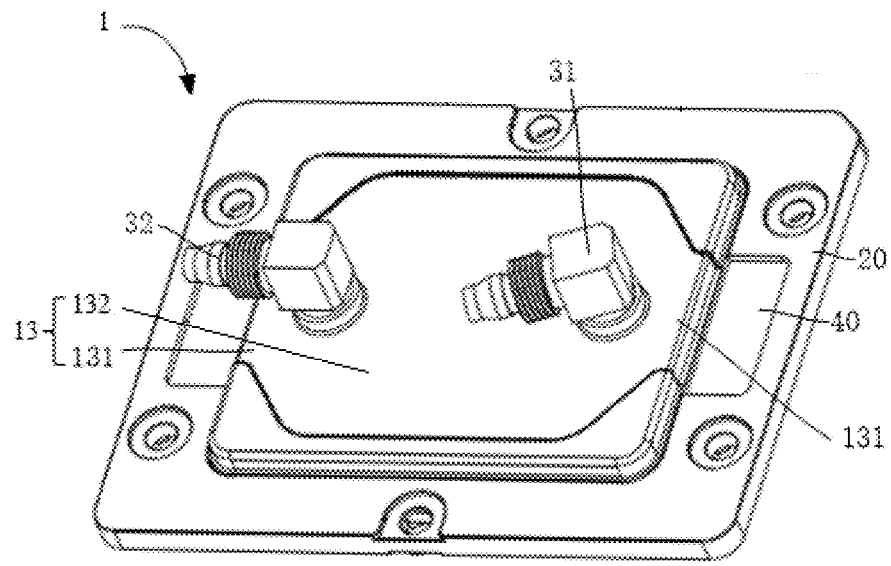
FIG. 1 is a schematic diagram showing the structure of a liquid-cooling plate for a CPU according to an embodiment of the present invention.
Figure 2:
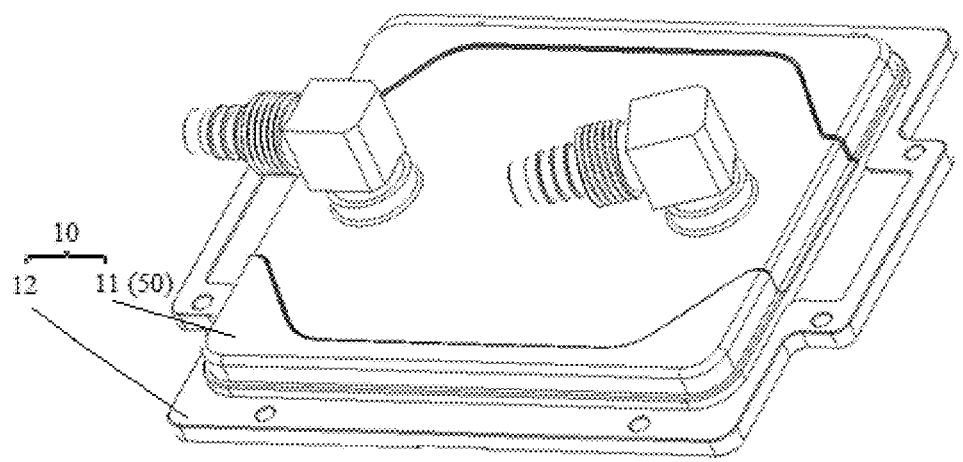
FIG. 2 is a schematic diagram showing the structure of a base according to an embodiment of the present invention.

FIG. 1 is a schematic diagram showing the structure of a liquid-cooling plate 1 for a CPU according to an embodiment. FIG. 2 is a schematic diagram showing the structure of a base according to an embodiment. As shown in FIGS. 1 to 2, the liquid-cooling plate 1 for a CPU (not shown) according to the present embodiment includes a circulating liquid-cooling main body 50, a peripheral frame 20, a base 10 and a liquid accumulation reservoir 40. The base 10 has a central portion 11 and a peripheral portion 12 surrounding the central portion 11. The peripheral frame 20 is arranged on the peripheral portion 12, with the central portion 11 being exposed therefrom. A step is formed between the central portion 11 and the peripheral portion 12 so that the central portion 11 is raised over the peripheral portion 12. The central portion 11 defines an interior space and is provided with a cover 13 and two faucets 31, 32. The interior space is adapted to accommodate the circulating liquid-cooling main body 50 and is closed by the cover 13. The two faucets 31, 32 are located above the cover 13 and brought into communication with the circulating liquid-cooling main body 50. The liquid accumulation reservoir 40 is located external to the central portion 11 and adapted to contain a liquid leaked from the faucets 31, 32. The liquid accumulation reservoir 40 can store the leaked liquid to avoid it from causing a short circuit across a component or within a motherboard, which may affect normal operation of the device or bring damage to components in the system, shortening a service life of a server.

In the present embodiment, the circulating liquid-cooling main body 50 includes an internal flow path, an inlet port and an outlet port. The internal flow path has an inlet pipe and an outlet pipe. One end of the inlet port is connected to the inlet pipe, and a cooling liquid is introduced to the other end of the inlet port. One end of the outlet port is connected to the outlet pipe, and the cooling liquid that has circulated inside the circulating liquid-cooling main body 50 is introduced to the other end of the outlet port. Both the inlet and outlet ports extend through the cover 13 out of the interior space, and both the other ends of the inlet and outlet ports are located above the cover 13. In this way, after introduced to the circulating liquid-cooling main body 50 from the inlet port, the cooling liquid flows through the internal flow path and absorbs heat from the CPU situated under the liquid-cooling plate 1 by means of forced convection. After that, it exits from the outlet port for circulation.

The inlet and outlet ports are respectively connected to the faucets 31 and 32 and thus to pipes of an external device for providing the cooling liquid. The faucets 31, 32 are rotatably raised over a top surface of the cover 13. Both at the junction between the inlet port and the faucet 31 and at the junction between the outlet port and the faucet 32, there are joint gaps above the cover 13, from which the liquid may leak.

Figure 3A:
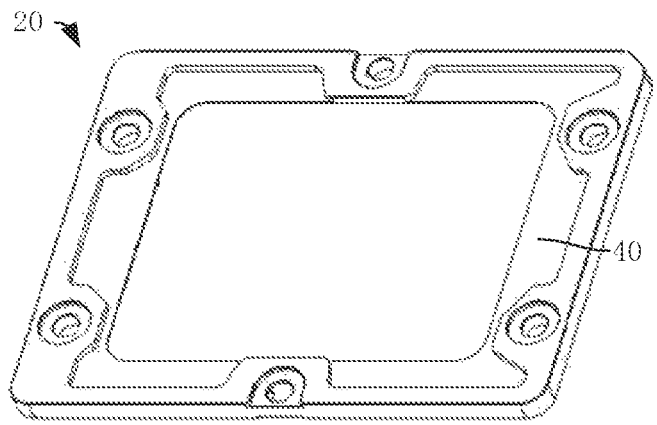
FIGS. 3a to 3b are schematic diagrams showing the structure of a peripheral frame according to an embodiment of the present invention.
Figure 3B:
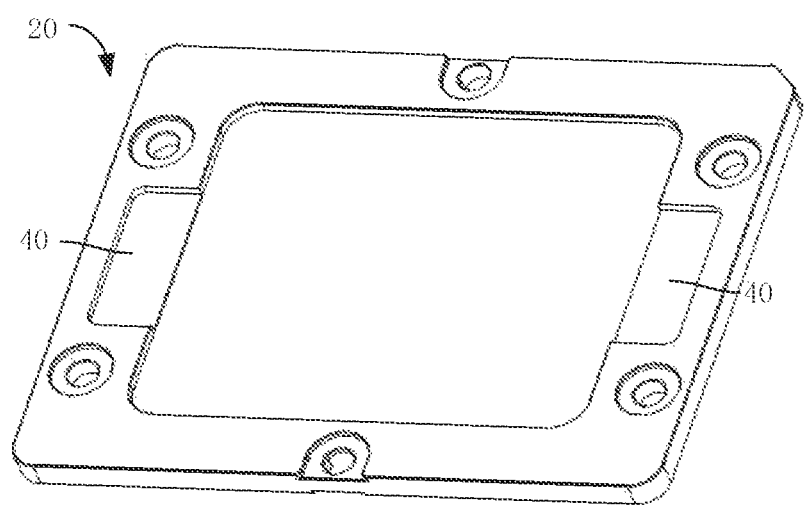

FIGS. 3a to 3b are schematic diagrams showing the structure of the peripheral frame according to an embodiment. As shown in FIGS. 3a to 3b, the liquid accumulation reservoir 40 has a depth ranging from 1 mm to h, where h represents a thickness of the peripheral frame 20. In this way, it can contain a certain amount of the leaked liquid, allowing some time for troubleshooting and repair of an operator. In addition, the peripheral frame 20 is an annulus, and the liquid accumulation reservoir 40 is disposed in the proximity of an inner edge of the peripheral frame 20. In the case that the depth of the liquid accumulation reservoir 40 is less than h, the liquid accumulation reservoir 40 is delimited by the peripheral frame 20 and the central portion 11. In the case that the depth of the liquid accumulation reservoir 40 is equal to h, the liquid accumulation reservoir 40 is delimited by the peripheral frame 20, the peripheral portion 12 and the central portion 11. In this way, simply by forming a blind or through recess in the peripheral frame 20, the liquid accumulation reservoir 40 can be formed along with deployment. This design is reasonable and simple in structure, allows easy processing and fabrication, does not require additional material and cost, dispenses with an additional occupation of an interior space of the server, and provides a redundant space for the layout of other components on the motherboard.

The peripheral frame 20 and the base 10 may either form an integral component, or be separate components. In the latter case, a water-resistant film (not shown) may be provided over an inner wall of the liquid accumulation reservoir 40 in order to close a gap between the peripheral frame 20 and the base 10.

Either one or two such liquid accumulation reservoirs 40 may be included. In the case of a single liquid accumulation reservoir 40, the liquid accumulation reservoir 40 may have a generally annular (as shown in FIG. 3a), U-like, L-like or rectangular shape. In the case of two liquid accumulation reservoirs 40, they may have generally U-like, L-like or rectangular shapes (as shown in FIG. 3b). The liquid accumulation reservoir 40 may be formed and shaped in the peripheral frame 20 depending on the actual circumstances of the peripheral frame 20 such that the liquid accumulation reservoir 40 bypasses any location where a connecting hole is to be formed and encompasses any location not intended for the formation of a connecting hole there. In this way, the liquid accumulation reservoir 40 can have a large volume, which allows a sufficient time for troubleshooting and repair of the operator. Moreover, such a design is easier to implement.

There is a height difference between the top surfaces of the cover 13 and the central portion 11, and the top surface of the cover 13 is lower than that of the central portion 11. The height difference is 0.3 mm.

The cover 13 has a liquid accumulation portion 132 and a liquid guide portion 131, which communicate with each other. The liquid accumulation portion 132 is adapted for preliminary storage of the liquid leaked from the faucets 31, 32, and the liquid guide portion 131 is located on one or two sides of the liquid accumulation portion 132. The liquid accumulation reservoir 40 is located external to the liquid guide portion 131. In particular, In the case of a single liquid accumulation reservoir 40, the cover 13 has one liquid guide portion 131, and the top surface of the cover 13 is inclined so as to be lowest at an edge of the liquid guide portion 131 proximal to the liquid accumulation reservoir 40. In the case of two liquid accumulation reservoirs 40, the cover 13 has two liquid guide portions 131. The two liquid accumulation reservoirs 40 are located on two sides of the two liquid guide portions 131. Additionally, the top surface of the cover 13 may be a horizontal surface spaced from the top surface of the peripheral frame 20 by a constant height difference. Alternatively, the top surface of the cover 13 may be ridged so as to be high at the center and low at two opposing edges. Moreover, the top surface of the cover 13 may be lowest at edges of the liquid guide portions 131 proximal to the liquid accumulation reservoirs 40. A projection of each liquid guide portion 131 on the top surface of the peripheral frame 20 is joined to a respective one of the liquid accumulation reservoirs 40 so that the liquid leaked from the faucets 31, 32 can flow into the liquid accumulation reservoirs 40 through the respective liquid guide portions 131. Preferably, the liquid guide portion 131 is chamfered at the edges proximal to the liquid accumulation reservoir 40 so as to guide the liquid from the cover 13 into the liquid accumulation reservoir 40. A length of the liquid accumulation reservoir 40 in the direction of extension thereof is greater than or equal to a length of the liquid guide portion 131 in the direction of extension of the liquid accumulation reservoir 40. This allows all the leaked liquid to flow from the liquid guide portion 131 into the liquid accumulation reservoir 40.

Optionally, the liquid accumulation reservoir 40 is provided therein with a water-absorbing medium made of a water-absorbing material such as sponge or the like.

The liquid-cooling plate 1 for a CPU further includes a detection rope wound around the junctions of the two faucets 31, 32 and the inlet and outlet ports. The detection rope is wired, together with the inlet and outlet ports, to an external monitoring device for monitoring the occurrence of liquid leakage.

The liquid-cooling plate 1 of the present embodiment may be deployed in the following way. A thermally conductive silicone grease layer is applied to the surface of a CPU chip, and the liquid-cooling plate 1 is secured to an intended location of the motherboard so that it is fitted over and firmly secured to the CPU chip. The inlet and outlet ports are respectively connected to the pipes of the external device for providing the cooling liquid. The water leak detection rope for the purpose of monitoring is deployed and connected to the external monitoring device for monitoring the occurrence of liquid leakage.

In summary, the present invention provides a liquid-cooling plate 1 for a CPU, which integrates a liquid accumulation reservoir, thus resulting in a saving of an interior space of a server, dispensing with an additional occupation of the server's interior space and providing a redundant space for the layout of other components on a motherboard. Moreover, the liquid accumulation reservoir adopts a design which is reasonable and simple in structure, allows easy processing and fabrication, and does not require additional material and cost. Further, a short circuit across a component or within the motherboard caused by liquid leakage, which may affect normal operation of the equipment, or bring damage to components in the system and shorten the server's lifespan, is prevented. Furthermore, a time for troubleshooting and repair by an operator is allowed.

It is to be noted that, as used herein, the terms "first", "second" and the like are only meant to distinguish various components, elements, steps, etc. from each other rather than indicate logical or sequential orderings thereof, unless otherwise indicated or specified.

It is to be understood that while the invention has been described above with reference to preferred embodiments thereof, it is not limited to these embodiments. In light of the above teachings, any person familiar with the art may make many possible modifications and variations to the disclosed embodiments or adapt them into equivalent embodiments, without departing from the scope of the invention. Accordingly, it is intended that any and all simple variations, equivalent changes and modifications made to the foregoing embodiments based on the substantive disclosure of the invention without departing from the scope thereof fall within this scope.

What is claimed is:

1. A liquid-cooling plate for a CPU, comprising a circulating liquid-cooling main body, a peripheral frame, a base and at least one liquid accumulation reservoir, the base having a central portion and a peripheral portion surrounding the central portion, the peripheral frame disposed on the peripheral portion so that the central portion is exposed from the peripheral frame, the central portion and the peripheral portion forming a step therebetween so that the central portion is raised over the peripheral portion, the central portion defining an interior space and having a cover and two faucets, the interior space configured to accommodate the circulating liquid-cooling main body, the cover closing the interior space, the two faucets located above the cover and communicating with the circulating liquid-cooling main body, the at least one liquid accumulation reservoir located external to the central portion and configured to contain a liquid leaked from at least one of the two faucets;

wherein a height difference is formed between a top surface of the cover and a top surface of the central portion, and the top surface of the cover is lower than the top surface of the central portion.

2. The liquid-cooling plate for a CPU according to claim 1, wherein the at least one liquid accumulation reservoir has a depth ranging from 1 mm to a thickness of the peripheral frame.

3. The liquid-cooling plate for a CPU according to claim 2, wherein the peripheral frame is an annulus, and the at least one liquid accumulation reservoir is arranged proximal to an inner edge of the peripheral frame, wherein if the depth of the at least one liquid accumulation reservoir is less than h, the at least one liquid accumulation reservoir is delimited by the peripheral frame and the central portion, and wherein if the depth of the at least one liquid accumulation reservoir is equal to h, the at least one liquid accumulation reservoir is delimited by the peripheral frame, the peripheral portion and the central portion.

4. The liquid-cooling plate for a CPU according to claim 1, wherein the peripheral frame and the base are integrally or separately formed with each other.

5. The liquid-cooling plate for a CPU according to claim 4, wherein the peripheral frame and the base are separately formed with each other, a water-resistant film is provided on an inner wall of the at least one liquid accumulation reservoir, and the water-resistant film is configured to close a gap between the peripheral frame and the base.

6. The liquid-cooling plate for a CPU according to claim 1, wherein a number of the at least one liquid accumulation reservoir is one or two, wherein if the number of the at least one liquid accumulation reservoir is one, the liquid accumulation reservoir has an annular, U-like, L-like or rectangular shape, and wherein if the number of the at least one liquid accumulation reservoir is two, the two liquid accumulation reservoirs have U-like, L-like or rectangular shapes.

7. The liquid-cooling plate for a CPU according to claim 6, wherein the faucets are rotatably disposed above a top surface of the cover, and wherein a joint gap is formed at the junction of each of the faucets and the circulating liquid-cooling main body, and the joint gap is located right above the cover.

8. The liquid-cooling plate for a CPU according to claim 7, wherein the cover has a liquid accumulation portion and a liquid guide portion, which are in communication with each other, the liquid accumulation portion configured to preliminarily store the liquid leaked from the faucets, the liquid guide portion located on one or two sides of the liquid accumulation portion, and wherein the at least one liquid accumulation reservoir is located external to the liquid guide portion.

9. The liquid-cooling plate for a CPU according to claim 8, wherein if the number of the at least one liquid accumulation reservoir is one, the cover has one said liquid guide portion, and the top surface of the cover is inclined so as to be lowest at an edge of the liquid guide portion proximal to the liquid accumulation reservoir, wherein if the number of the at least one liquid accumulation reservoir is two, the cover has two said liquid guide portions which are located on two sides of the two liquid guide portion, and the top surface of the cover is formed as a horizontal surface that is spaced from a top surface of the peripheral frame by a constant height difference, or as a ridged surface which is high at center and low at two opposing edges and is lowest at edges of the two liquid guide portions proximal to the respective two liquid accumulation reservoirs, and wherein a projection of each of the liquid guide portions on the top surface of the peripheral frame is joined to the respective liquid accumulation reservoir so that the liquid leaked from the faucets flows into the at least one liquid accumulation reservoir through the liquid guide portions.

10. The liquid-cooling plate for a CPU according to claim 9, wherein the liquid guide portion is chamfered at the edges proximal to the liquid accumulation reservoir so as to guide the liquid from the cover into the liquid accumulation reservoir.

11. The liquid-cooling plate for a CPU according to claim 10, wherein a length of the liquid accumulation reservoir in a direction of extension thereof is greater than or equal to a length of the liquid guide portion in the direction of extension of the liquid accumulation reservoir.

12. The liquid-cooling plate for a CPU according to claim 1, further comprising a water-absorbing medium disposed in the liquid accumulation reservoir.

13. The liquid-cooling plate for a CPU according to claim 1, further comprising a detection rope which is wound successively around the two faucets and is configured to detect whether liquid leakage occurs in any of the two faucets.

14. The liquid-cooling plate for a CPU according to claim 1, wherein the height difference is 0.3 mm.

* * * * *